United States Patent

Kuzma et al.

(10) Patent No.: US 6,735,977 B2
(45) Date of Patent: May 18, 2004

(54) MAGNETIC HOLDING FIELD FOR CRYOGENICALLY ACCUMULATED POLARIZED $^{129}$XENON

(75) Inventors: Nicholas N. Kuzma, Princeton, NJ (US); Ian Nelson, Chapel Hill, NC (US)

(73) Assignee: Medi-Physics, Inc., Princeton, NJ (US)

( * ) Notice: Subject to any disclaimer, the term of this patent is extended or adjusted under 35 U.S.C. 154(b) by 0 days.

(21) Appl. No.: 10/223,237

(22) Filed: Aug. 19, 2002

(65) Prior Publication Data

US 2003/0033830 A1 Feb. 20, 2003

Related U.S. Application Data

(60) Provisional application No. 60/313,361, filed on Aug. 17, 2001.

(51) Int. Cl.$^7$ ............................. F25J 1/00; F25B 21/00
(52) U.S. Cl. ............................. 62/601; 62/3.1; 62/600; 62/637
(58) Field of Search ..................... 62/601, 3.1, 600, 62/637

(56) References Cited

U.S. PATENT DOCUMENTS

| | | | |
|---|---|---|---|
| 5,809,801 A | * | 9/1998 | Cates et al. .................. 62/637 |
| 5,809,901 A | | 9/1998 | Gutzmer ....................... 62/637 |
| 5,860,295 A | * | 1/1999 | Cates et al. .................. 62/637 |
| 6,079,213 A | * | 6/2000 | Driehuys et al. ............... 62/3.1 |
| 6,199,385 B1 | * | 3/2001 | Driehuys et al. .............. 62/51.1 |
| 6,269,648 B1 | | 8/2001 | Hasson et al. |
| 6,293,111 B1 | * | 9/2001 | Nacher et al. ................ 62/51.1 |

FOREIGN PATENT DOCUMENTS

WO WO 00/23797 4/2000

OTHER PUBLICATIONS

Gatzke, et al. Phys Rev Lett 70, 690, 1993.

Cates, et.al. Phys Rev Lett 65, 2591, 1990.

* cited by examiner

Primary Examiner—William C. Doerrler
(74) Attorney, Agent, or Firm—Robert F. Chisholm (57) ABSTRACT

An apparatus and a method for providing a magnetic holding field about a chamber for accumulating frozen $^{129}$Xe. The apparatus includes a magnetic field source and a yoke for supporting the magnetic field source about the chamber. The magnetic field source provides a magnetic holding field having a field strength of greater than 2 kiloGauss. The apparatus may further include yoke for coupling the magnetic holding field through a portion of the chamber.

24 Claims, 6 Drawing Sheets

MAGNETIC HOLDING FIELD FOR CRYOGENICALLY ACCUMULATED POLARIZED $^{129}$XENON

This application claims the benefit of provisional application No. 60/313,361, filed on Aug. 17, 2001.

FIELD OF THE INVENTION

The present invention relates to the field of hyperpolarized inert gases. More particularly, the present invention relates to a method for minimizing the loss of $^{129}$Xe polarization during the cryogenic accumulation process.

BACKGROUND OF THE INVENTION

As is known in the art, polarized $^{129}$Xe must be separated from the 4He carrier gas. Due to the high freezing/melting point of Xe, about 160K, separation from the carrier gas is typically accomplished by freezing the Xe out of the mixture in liquid nitrogen.

Gatzke et al., in Phys Rev Lett 70, 690, 1993, have established that fields of greater than 500 Gauss are required to achieve the longest possible polarization relaxation time of solid $^{129}$Xe of about 2–3 hours at 77K. Cates et al., in Phys Rev Lett 65, 2591, 1990, determined that, when frozen in liquid $N_2$ at 77K in a sealed Pyrex cell, $^{129}$Xe relaxation rates are essentially independent of magnetic field strength above 500G. In view of these findings, polarizers today position permanent magnets providing a field strength of about 500G around solid $^{129}$Xe.

However, further investigation supporting the present invention has revealed that this field strength, while sufficient for minimizing relaxation at 77K, is insufficient for minimizing relaxation at temperatures closer to the melting point. The relaxation rate of the solid $^{129}$Xe can be very fast near its freezing point, limiting the amount of $^{129}$Xe polarization which is retained throughout the accumulation process. Presently, a factor of 2 or more in polarization is lost in the freezing and thawing process.

There is therefore a need for a system and method of reducing nuclear-spin relaxation rates when melting frozen $^{129}$Xe.

SUMMARY OF THE INVENTION

In view of the needs of the art, the present invention provides a yoke supporting a magnet which provides a magnetic field of at least 2 kiloGauss about frozen $^{129}$Xe which is to be melted and collected.

The yoke of the present invention supports a magnet about the entire region of a collector where frozen $^{129}$Xe accumulates. The yoke thereby provides a holding magnetic field which extends through the volume of $^{129}$Xe accumulation. The collector is desirably constructed in the form of a 'cold finger' as is known in the art. The holding magnetic field may be induced by permanent magnets, electromagnets, superconducting magnets, or standard magnets. The holding field may further be provided by a yoke body which couples the magnetic field of the magnets about the cold finger.

The present invention further provides a method for reducing the relaxation rate of accumulated polarized $^{129}$Xe in a chamber. The method includes the step of positioning the chamber in a magnetic holding field having a magnetic field strength of greater than 2 kiloGauss. The method further maintains the accumulated $^{129}$Xe in the holding field as the accumulated $^{129}$Xe is thawed and subsequently recrystallized.

DESCRIPTION OF THE EMBODIMENTS OF THE PRESENT INVENTION

The present invention recognizes that the relaxation rate of solid $^{129}$Xe at temperatures higher than approximately 120K is strongly dependent on the holding magnetic field strength. The present invention therefore provides a holding field strength of at least 2 kiloGauss (kG) in order to minimize the loss of $^{129}$Xe polarization during the accumulation process. The holding magnetic field may be induced by permanent magnets, electromagnets, superconding magnets, or standard magnets. The holding magnetic field desirably extends throughout the volume in which the $^{129}$Xe is frozen. The temperature of the $^{129}$Xe may then be reduced to below its freezing point, resulting in the solid $^{129}$Xe with minimum loss of polarization. The benefits of the present invention are also realized during thawing and subsequent recrystallization of the frozen polarized $^{129}$Xe.

The holding field of the present invention is desirably devoid of large field gradients which may depolarize the gaseous $^{129}$Xe during thawing or gas flow. As a result, the magnetic field should be relatively large spatially so as to provide a field of at least about 2 kG and gradients of less than about 10%/cm. More desirably, the magnetic holding fields of the present invention provide at least about 5 kG and gradients of less than about 1%/cm.

Figure 1:
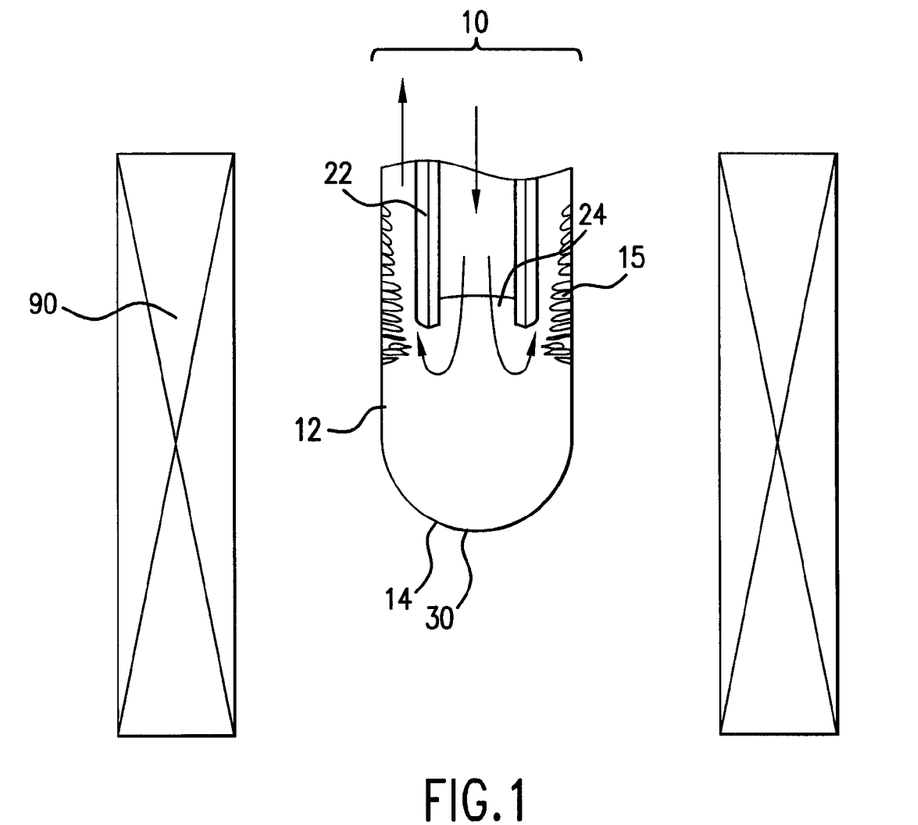
FIG. 1 is a schematic depicting a cold finger for accumulating frozen polarized $^{129}$Xe positioned within a magnetic holding field of the present invention.

FIG. 1 depicts a cold finger 10 for accumulating frozen polarized $^{129}$Xe positioned within a holding field provided by a magnetic field source 90 of the present invention. Cold finger 10 desirably forms part of a gas polarizing system that is the subject of U.S. Pat. No. 5,809,801, the disclosure of which is incorporated by reference herein in its entirety. Cold finger 10 includes an elongate tubular glass accumulator 12 having a closed free end defining a collection bowl 14. An elongate inlet tube 22 is coaxially positioned within accumulator 12 and provides a flow of gas mixture including polarized xenon therethrough. Inlet tube 22 includes an open free end 24 in spaced overlying registry with collection bowl 14. Magnetic field source 90 of the present invention provides a magnetic holding field of at least 2 kG about the free end of accumulator 12.

A pressurized gas mixture including hyperpolarized $^{129}$Xe, such as a He—$N_2$—Xe gas mixture, flows into accumulator 12 through inlet tube 22. The mixture flows through inlet tube 22 at a pressure of about 4.5 atm just above the melting temperature for the xenon, in this instance about 160K. As the mixture flows around the free end of inlet tube 22 and comes into contact with the cold glass wall of accumulator 12, the polarized $^{129}$Xe is deposited thereon in the form of snow. Throughout the process, magnetic field source 90 desirably provides a magnetic holding field that fully encompasses the portion 15 of accumulator 12 in which the $^{129}$Xe snow accumulates.

Figure 2:
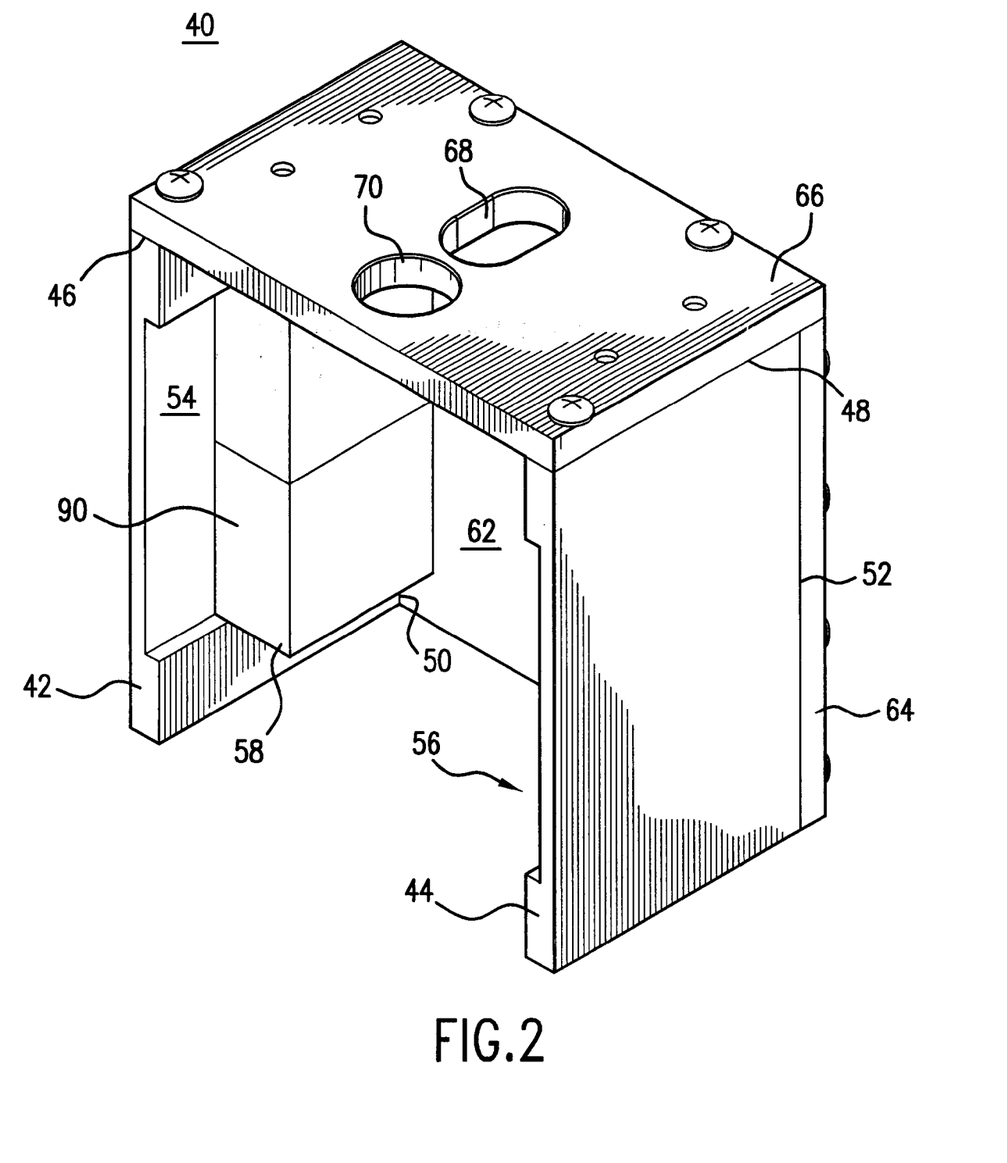
FIG. 2 depicts a first yoke of the present invention.

FIG. 2 depicts a yoke 40 of the present invention. Yoke 40 is desirably formed from magnetically permeable material and supports magnetic field source 90 about accumulator 12, desirably within a polarization device. Yoke 40 includes opposed first and second planar walls 42 and 44 having opposed top edges 46 and 48 and side edges 50 and 52, respectively. First and second planar walls 42 and 44 define opposed first and second open recesses 54 and 56, respectively. Recesses 54 and 56 receive magnetic field source 90 therein. Magnetic field source 90 includes first and second opposed magnets 58 and 60 (shown in FIG. 3) magnetically supported by planar walls 42 and 44 at recesses 54 and 56, respectively. Magnets 58 and 60 define therebetween an airgap 62 for accommodating cold finger 10 therein. Magnets 58 and 60 are selected so as to provide a low gradient field through airgap 62. The gradient of the holding field is desirably less than about 10%/cm and even more desirably less than about 1%/cm. A third planar wall 64 spans between side edges 50 and 52 of planar walls 42 and 44. A top planar plate 66 spans between top edges 46 and 48 of planar walls 42 and 44. Top planar plate 66 defines a first and second spaced-apart apertures 68 and 70 therethrough, each aperture 68 and 70 in fluid communication with cavity 62. First aperture 68 accommodates the free end of cold finger 10 therethrough so as to position the free end of accumulator 12 in airgap 62.

Figure 3:
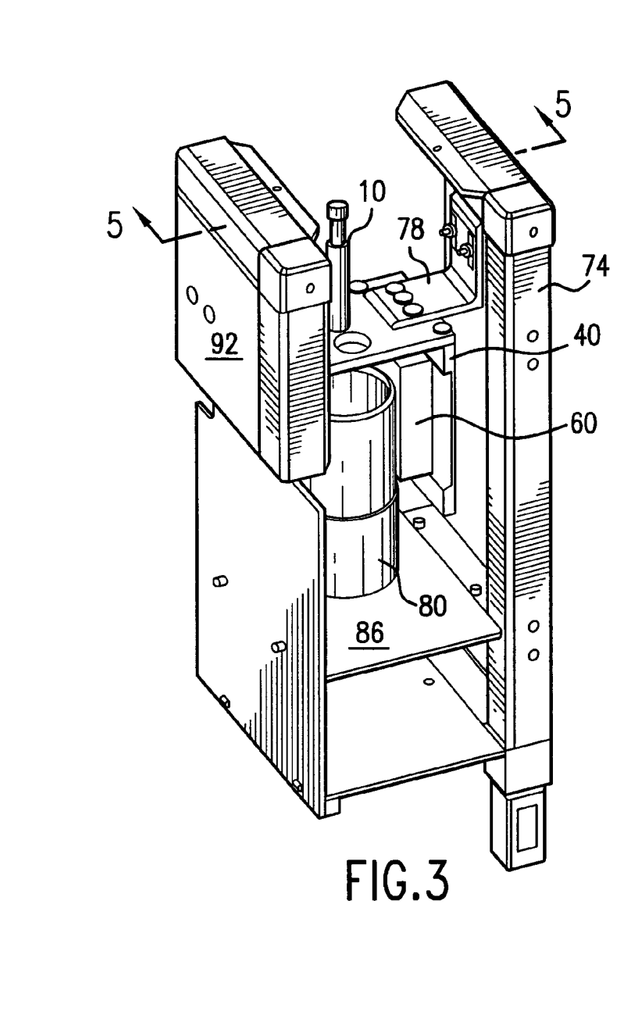
FIG. 3 is an oblique partial assembly view depicting the yoke of FIG. 2 positioned about a cold finger of a polarization device.
Figure 4:
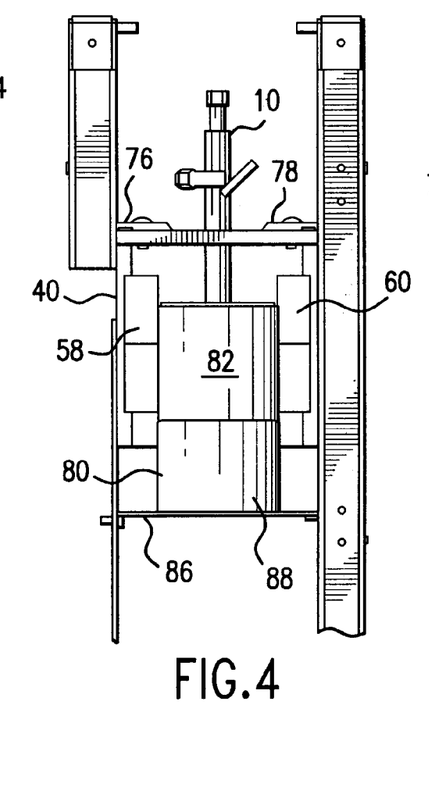
FIG. 4 is a side elevational view of the assembly of FIG. 3.
Figure 5:
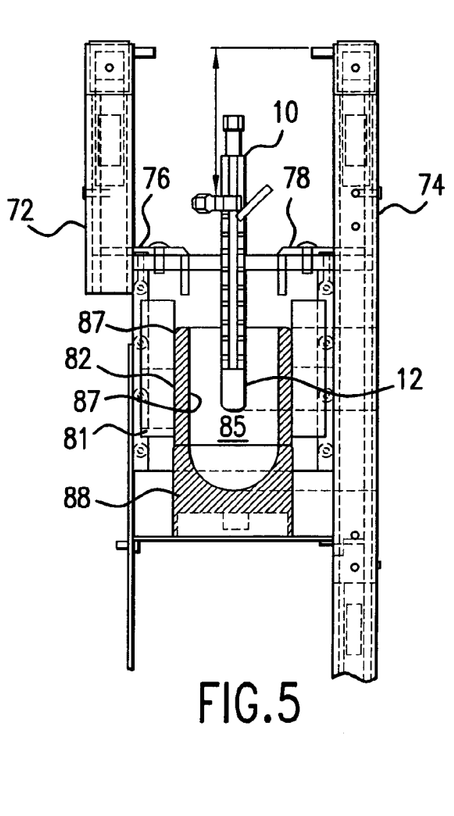
FIG. 5 is a cross-sectional view of the assembly of FIG. 3 taken through the line 5—5.

Referring now to FIGS. 3–5, yoke 40 mounts to a polarization device at its walls 72 and 74 by conventional L-brackets 76 and 78, although other mounting means are also contemplated by the present invention. So mounted, yoke 40 locates the free end of accumulator 12 in airgap 62. FIGS. 3–5 further depict a cryogenic dewar 80 located between magnets 58 and 60. Dewar 80 includes an upstanding annular wall 81 having an cylindrical exterior surface 82 and a cylindrical interior surface 84. Interior surface 84 defines a holding cavity 85 for receiving region 15 of cold finger 10 therein. Dewar 80 further includes an open end 87 and a closed end 88 positioned upon shelf 86 of the polarizer. Holding cavity 85 receives a volume of liquid $N_2$ for cooling the gas mixture flowed through inlet tube 22. Second aperture 70 of yoke 40 allows an operator easy access for delivering liquid $N_2$ into holding cavity 85. Airgap 62 is therefore desirably dimensioned to also accommodate dewar 80 therein.

Each of the yokes of the present invention provide a space in which polarized $^{129}$Xe may be either accumulated as a frozen solid or subsequently thawed. The airgaps provided by each yoke also desirably provide a low gradient field. The gradient of the field is desirably less than about 10%/cm and more preferably less than about 1%/cm. Each yoke couples the magnetic field from magnetic field source 90 about cold finger 10 and includes a magnetically permeable body for returning the magnetic field therethrough back to magnetic field source 90.

Figure 6:
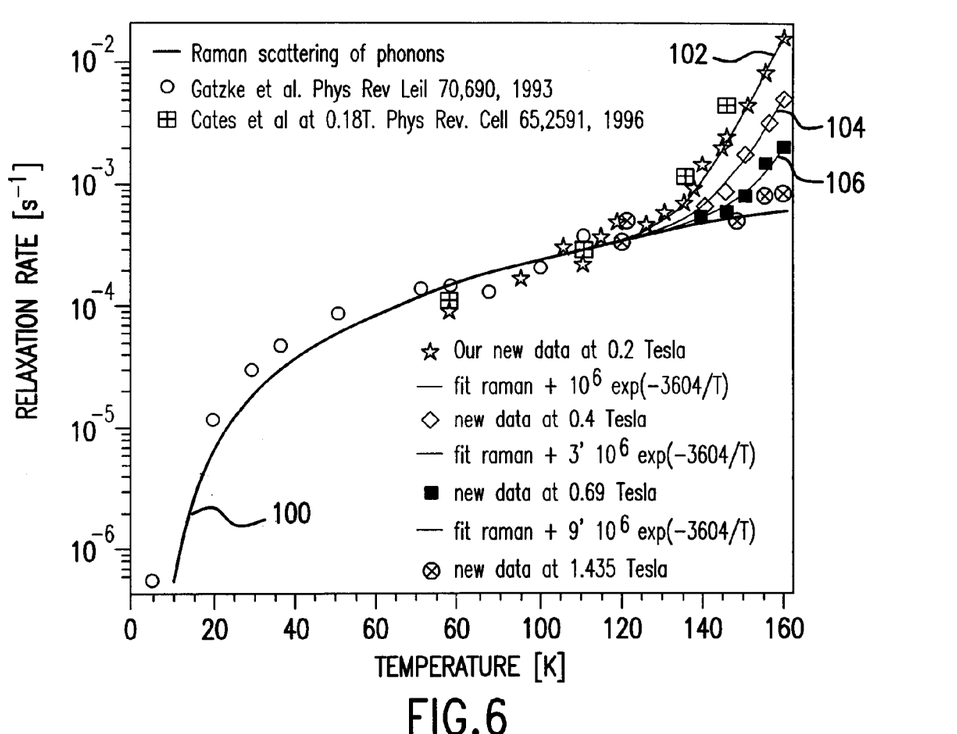
FIG. 6 is a graphical comparison of relaxation rates proposed by Gatzke against those of the present invention.

FIG. 6 depicts data generated in evaluating relaxation rates of polarized solid $^{129}$Xe as a function of temperature, for a given magnetic field. Line 100 the curve fit according to raman scattering of phonons. The Gatzke data points are represented by open circles. No Gatzke data points were acquired for temperatures above about 115K. Thus, when the Gatzke curve was fitted to those data points, the change of the relaxation rate from the Gatzke curve appears to be a slowly increasing function of temperature. The Cates data, represented by hatched squares, did not specify the field at which it was determined. Cates had measured the field dependence of the relaxation rate at 77K. That temperature dependence was determined at an unspecified field suggests that no field dependence was expected. The present invention provides new data suggesting that as field strength is reduced, at temperatures above about 120K the relaxation rate increases much more rapidly unless the magnetic field is also increased. Line 102 is fitted to new data, represented by solid stars, measuring field dependence of the relaxation rate in a 0.2 Tesla holding field. Line 104 is fitted to new data, represented by open diamonds, measuring field dependence of the relaxation rate in a 0.4 Tesla holding field. Line 106 is fitted to new data, represented by solid squares, measuring field dependence of the relaxation rate in a 0.69 Tesla holding field. New data represented by hatched circles was obtained by measuring field dependence of the relaxation rate in a 1.435 Tesla holding field. As the field strength increases, the relaxation rate will then approach the fitted Gatzke curve. The new data is also presented and discussed in Kuzma et al, Physical Review Letters, Volume 88, Number 14, of Apr. 8, 2002, which is incorporated by reference herein in its entirety.

Figure 7:
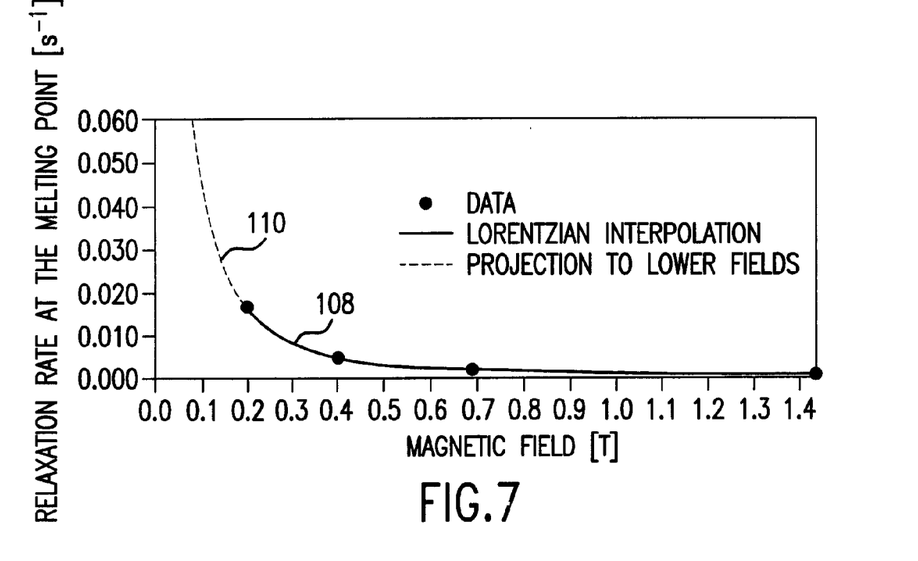
FIG. 7 is a graphical depiction comparing the relaxation rate with the magnetic field strength for a given temperature.

FIG. 7 shows the relaxation rate for $^{129}$Xe as a function of magnetic field at the melting temperature (160K). The data points are represented by solid circles. A Lorentzian interpolation between the data points is provided by solid line 108. Dashed line 110 represents the projected relationship between relaxation rate and still lower magnetic fields. Again, as the magnetic field is increased, the relaxation rate will decline.

Figure 8:
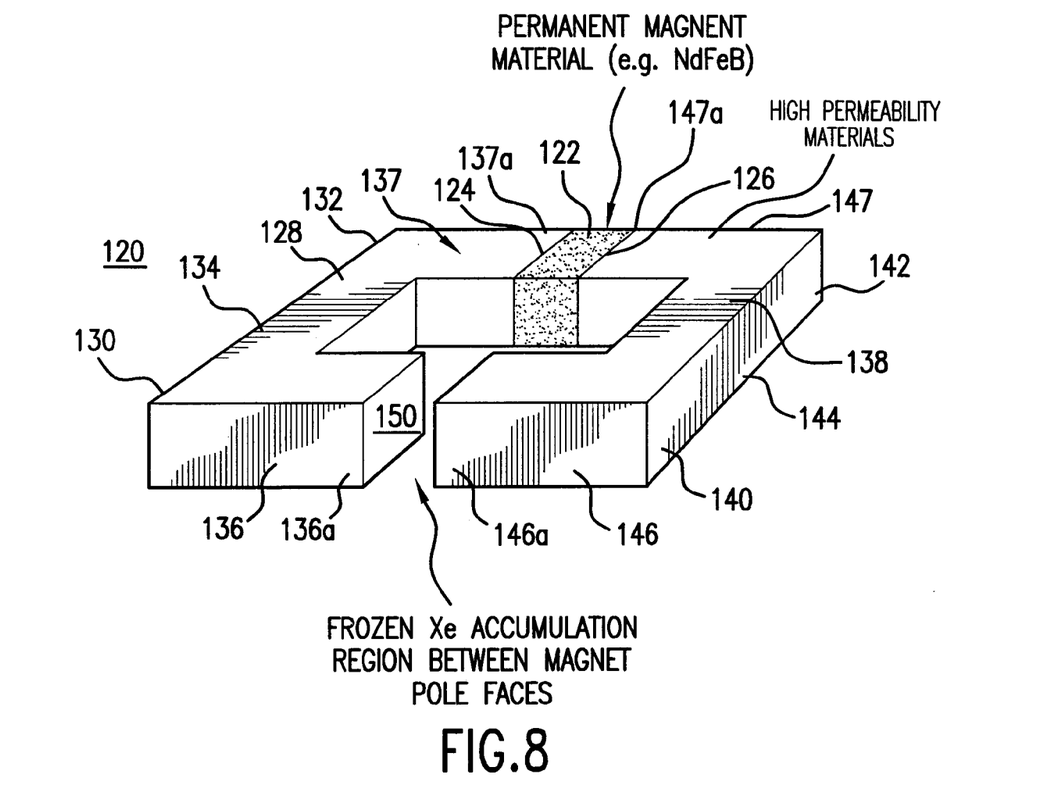
FIG. 8 is an alternate yoke of the present invention.

FIG. 8 depicts an alternate yoke 120 of the present invention. Yoke 120 may be substituted for magnets 50 and 52 of FIGS. 3–5 and for yoke 40 of FIGS. 3–5. Yoke 120 supports magnetic field source 90. Magnetic field source 90 includes a magnet 122 having opposed first and second poles, 124 and 126, respectively. Yoke 120 further includes a first arm 128 having a first end 130, a second end 132, and an elongate body portion 134 extending therebetween. First end 130 of body portion 134 supports a first transverse leg 136 and second end 132 of body portion 134 supports a second transverse leg 137. Yoke 120 also includes a second arm 138 having a first end 140, a second end 142, and an elongate body portion 144 extending therebetween. First end 140 of body portion 144 supports a first transverse leg 146 and second end 142 of body portion 144 supports a second transverse leg 147. First pole 124 of magnet 122 is coupled to the free end 137a of leg 137 and second pole 126 of magnet 122 is coupled to the free end 147a of leg 147. Free ends 136a and 146a of transverse legs 136 and 146, respectively, define an airgap 150 therebetween for receiving a portion of cold finger 10. It is further contemplated by the present invention that a physically longer magnet 122 may be employed which couples to the second ends 132 and 142 of body portions 134 and 144, respectively.

Figure 9:
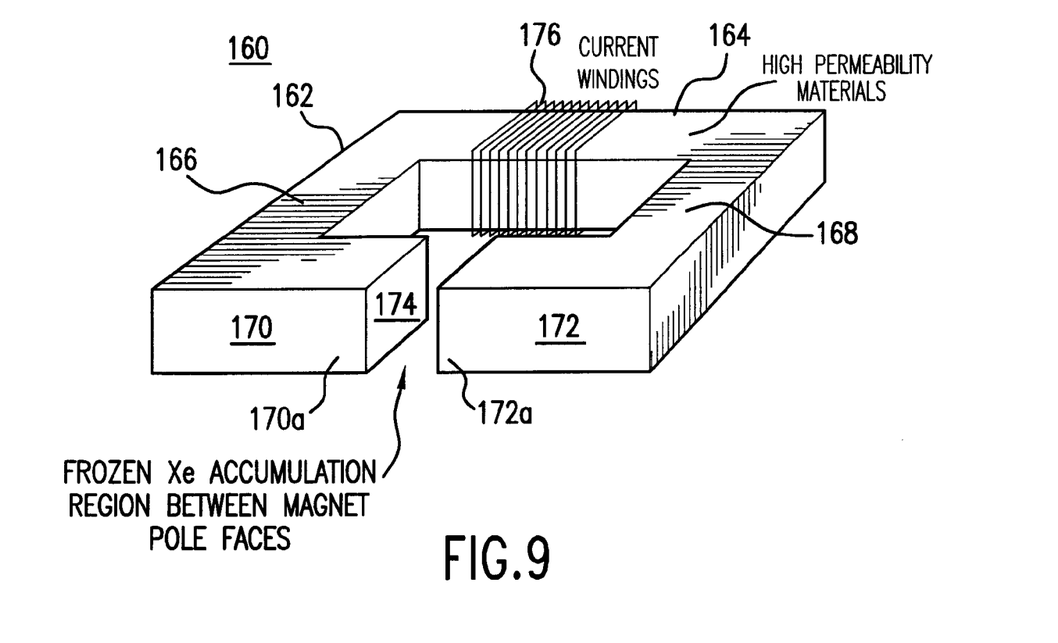
FIG. 9 is a second alternate yoke of the present invention.

FIG. 9 depicts a yoke 160 of the present invention. Yoke 160 may be substituted for magnets 50 and 52 of FIGS. 3–5 and supported in their place by yoke 40. Yoke 160 is formed of a high permeability material. Yoke 160 includes a block-C shaped body 162 having an elongate base member 164 supporting elongate transversely-spaced arms 166 and 168. Arm 166 supports a transversely-extending leg 170 at a first end 166a thereof. Arm 168 supports a transversely-extending leg 172 at a first end 168a thereof. The free ends 170a and 172a of legs 170 and 172, respectively, define an airgap 174 therebetween for receiving portion 15 of cold-finger 10. A conductive wire 176 is wound about base member 164 for imparting an electrical field to body 162 upon electrical current passing therethrough.

Figure 10:
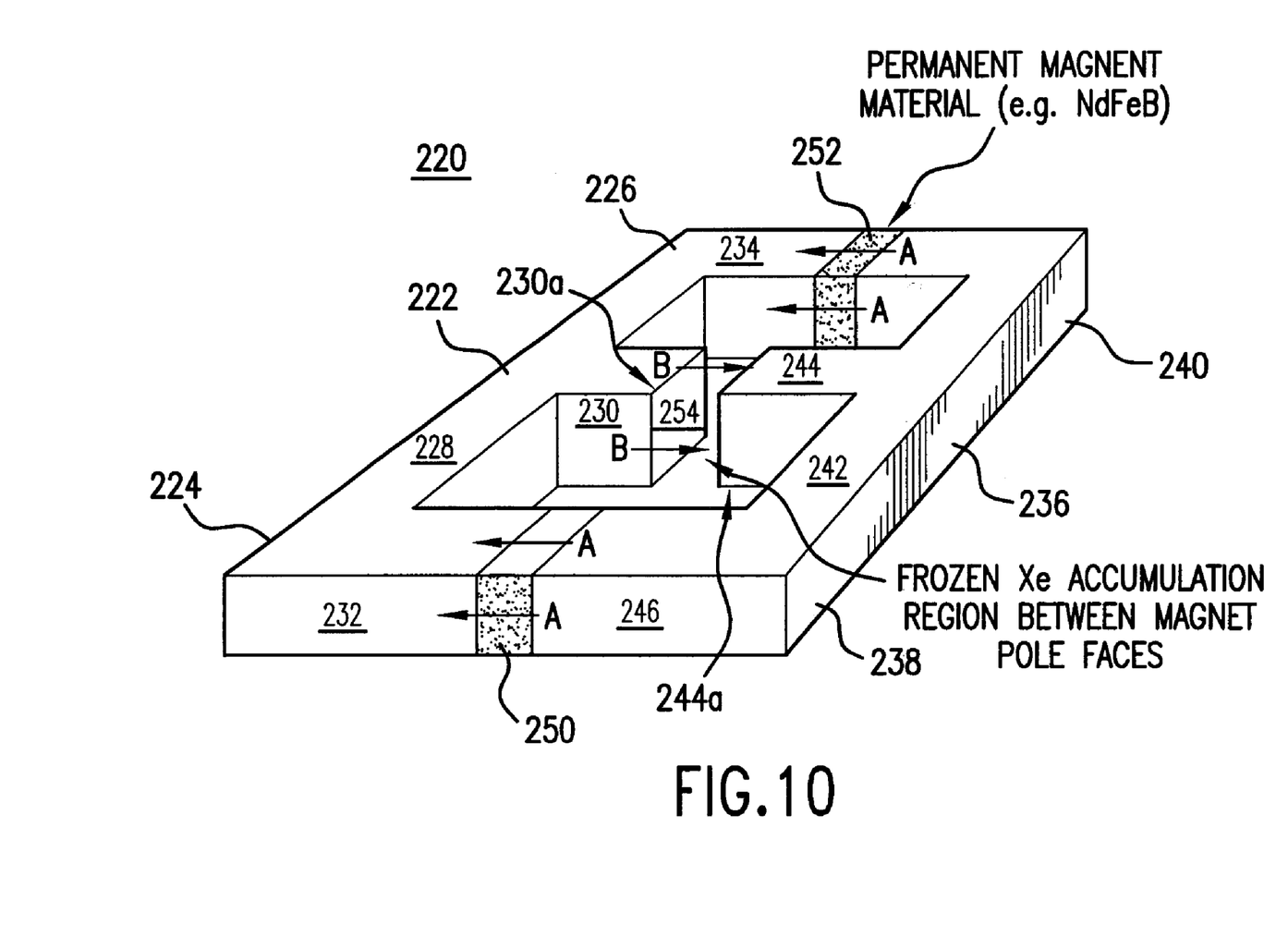
FIG. 10 is a third alternate yoke of the present invention.

FIG. 10 depicts yet another yoke 220 for coupling the magnetic holding field of the present invention. Yoke 220 may also be substituted for magnets 50 and 52 and for yoke 40 of FIGS. 3–5. Yoke 220 includes first elongate arm 222 having a first end 224, a second end 226, and an elongate body 228 extending therebetween. Body 228 supports first transversely-extending leg 230 midway along body 228, second transversely-extending leg 232 at first end 224, and third transversely-extending leg 234 at second end 226. Yoke 220 further includes second elongate arm 236 having a first end 238, an opposed second end 240, and an elongate body 242 extending therebetween. Arms 222 and 236 are formed of magnetically conductive, or high permeability, material. Body 242 supports first transversely-extending leg 244 at a location midway along body 238, second transversely-extending leg 246 at first end 238, and third transversely-extending leg 248 at second end 240. Yoke 220 further includes first magnet 250 coupled to second legs 232 and 246 and second magnet 252 coupled to third legs 234 and 248. Magnets 250 and 252 are desirably magnetically aligned such that their fields are directed, at their respective ends, from arm 236 to arm 222, as depicted by arrows A. The free ends 230a and 244a of legs 230 and 244, respectively define an airgap 254 therebetween for receiving a portion of cold finger 10. The magnetic field through airgap 254 conducts in an opposite direction to the fields at magnets 250 and 252, as shown by arrows B. The present invention further contemplates that physically longer magnets 250 and 252 may be employed which couple directly to first ends 224 and 238, and to second ends 226 and 240 of bodies 226 and 242, respectively.

While the particular embodiment of the present invention has been shown and described, it will be obvious to those skilled in the art that changes and modifications may be made without departing from the teachings of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An apparatus for providing a magnetic holding field about a chamber for accumulating frozen $^{129}$Xe, comprising:
   a magnetic field source, said source providing a magnetic holding field having a field strength of greater than 2 kiloGauss; and
   a yoke for supporting said magnetic field source about the chamber wherein said yoke further comprises a magnetically permeable yoke body, wherein said yoke body defines a recess into which is positioned a portion of the chamber into which frozen polarized $^{129}$Xe accumulates, said yoke coupling said magnetic holding field to said recess.

2. The apparatus of claim 1, wherein said magnetic field source provides a magnetic field strength between 2 kiloGauss and about 14.35 kiloGauss.

3. The apparatus of claim 1, wherein said magnetic field source is about 5 kiloGauss.

4. The apparatus of claim 1, wherein said yoke defines an air gap for receiving the chamber and wherein said magnetic field source provides a magnetic field having a gradient less than about 10%/cm.

5. The apparatus of claim 4, wherein said magnetic field source is selected from the group consisting of permanent magnets, electromagnets, superconducting magnets, and standard magnets.

6. The apparatus of claim 4, wherein said yoke further comprises a first and second opposed planar wall portion, each said first and second wall portion defining opposed first and second recesses, and said yoke further comprising first and second magnets received in said first and second recesses, respectively.

7. The apparatus of claim 6, wherein said yoke further comprises a third wall portion spanning between said first and second wall portions.

8. The apparatus of claim 7, wherein said first and second wall portions define first and second recesses for receiving said first and second magnets, respectively, about the chamber.

9. The apparatus of claim 1, wherein the chamber is defined by a cold finger and wherein said magnetic holding field fully encompasses the portion of the chamber where the frozen polarized $^{129}$Xe accumulates.

10. The apparatus of claim 4, wherein said yoke further comprises:
    a magnet having opposed first and second poles;
    a first arm having first and second ends and an elongate body portion extending therebetween and a first transverse leg supported by said first end of said body portion;
    a second arm having first and second ends and an elongate body portion extending therebetween and a first transverse leg supported by said first end of said body portion;
    said magnet being connected to said second ends of said first and second arms, said first transverse legs of said first and second arms defining an airgap therebetween for receiving a portion of the chamber.

11. The apparatus of claim 10, wherein said first arm further comprises a second transversely-extending leg at said second end thereof, said second leg in magnetic contact with said magnet, and wherein said second arm further comprises a second transversely-extending leg at said second end thereof, said second leg in magnetic contact with said magnet.

12. The apparatus of claim 11, wherein said magnet is selected from the group of a permanent magnet and an electromagnet.

13. The apparatus of claim 4, wherein said yoke further comprises:
    a first elongate arm having opposed first and second ends and an elongate body extending therebetween, said body supporting a first transversely-extending leg at a location between said first and second end;
    a second elongate arm having opposed first and second ends and an elongate body extending therebetween, said body supporting a first transversely-extending leg at a location between said first and second end;
    a first magnet in magnetic contact with the first ends of said first and second arms; and
    a second magnet in magnetic contact with the second ends of said first and second arms;
    wherein the free ends of said first and second legs define an airgap therebetween for receiving a portion of the chamber.

14. The apparatus of claim 13, wherein said first arm further comprises second and third transversely-extending legs at said first and second ends thereof, respectively, said second and third legs in magnetic contact with said first and second magnets, respectively, and wherein said second arm further comprises second and third transversely-extending legs at said first and second ends thereof, respectively, said second and third legs in magnetic contact with said first and second magnets, respectively.

15. A method for reducing the relaxation rate of accumulated polarized $^{129}$Xe in a chamber comprising the steps of:
supporting a magnetic field source on a yoke, wherein said yoke defines an air gap for receiving the chamber and wherein said magnetic field source provides a magnetic field of greater than 2 kiloGauss and having a gradient less than about 10%/cm; and
positioning the chamber in said magnetic holding field.

16. The method of claim 15, wherein said yoke further comprises a magnetically permeable yoke body, wherein said yoke body defines a recess into which is positioned a portion of the chamber into which frozen polarized $^{129}$Xe accumulates, said yoke coupling said magnetic holding field to said recess.

17. The method of claim 16, further comprising the steps of thawing the polarized $^{129}$Xe and recrystallizing the polarized $^{129}$Xe.

18. The method of claim 16, further comprising the step of maintaining the accumulated polarized $^{129}$Xe in the magnetic field of said positioning step throughout said thawing step.

19. The method of claim 16, wherein said positioning step further comprises providing a magnetic holding field having a magnetic field strength between 2 kiloGauss and 14.35 kiloGauss.

20. The method of claim 16, wherein said positioning step further comprises providing a magnetic holding field having a magnetic field strength of about 5 kiloGauss.

21. The method of claim 16, wherein said positioning step further comprises fully encompassing the portion of the chamber where frozen polarized $^{129}$Xe accumulates within said magnetic holding field.

22. The apparatus of claim 4, wherein said magnetic field source is about 5 kiloGauss.

23. The apparatus of claim 4, wherein said yoke defines a air gap for receiving the chamber and wherein said magnetic field source provides a magnetic field having a gradient less than about 10%/cm.

24. The apparatus of claim 4, wherein the chamber is defined by a cold finger and wherein said magnetic holding field fully encompasses the portion of the chamber where the frozen polarized $^{129}$Xe accumulates.

* * * * *